US010923859B2

United States Patent
Lee et al.

(10) Patent No.: US 10,923,859 B2
(45) Date of Patent: Feb. 16, 2021

(54) CROSSTALK REDUCING CONNECTOR PIN GEOMETRY

(71) Applicant: Intel Corporation, Santa Clara, CA (US)

(72) Inventors: Jaejin Lee, Beaverton, OR (US); Jun Liao, Portland, OR (US); Xiang Li, Portland, OR (US); George Vergis, Portland, OR (US); Christopher E. Cox, Placerville, CA (US)

(73) Assignee: Intel Corporation, Santa Clara, CA (US)

( * ) Notice: Subject to any disclaimer, the term of this patent is extended or adjusted under 35 U.S.C. 154(b) by 40 days.

(21) Appl. No.: 16/389,781

(22) Filed: Apr. 19, 2019

(65) Prior Publication Data

US 2019/0245309 A1    Aug. 8, 2019

(51) Int. Cl.
*H01R 13/6471*    (2011.01)
*H05K 5/00*    (2006.01)
(Continued)

(52) U.S. Cl.
CPC ..... *H01R 13/6471* (2013.01); *H01R 12/7076* (2013.01); *H01R 12/73* (2013.01); *H05K 1/18* (2013.01); *H05K 5/0069* (2013.01); *H05K 5/0247* (2013.01); *H01R 12/721* (2013.01); *H01R 13/2442* (2013.01);
(Continued)

(58) Field of Classification Search
CPC ............ H01R 13/6461; H01R 13/6471; H01R 12/721; H01R 12/73; H01R 13/2442
See application file for complete search history.

(56) References Cited

U.S. PATENT DOCUMENTS 5,697,817 A * 12/1997 Bouchan ................ H01R 24/64
439/676
6,165,018 A * 12/2000 Arnett ................ H01R 13/7195
439/620.16
(Continued)

FOREIGN PATENT DOCUMENTS

| CN | 202695861 U | 1/2013 |
| WO | 2013/100929 A1 | 7/2013 |
| WO | 2018031283 A1 | 2/2018 |

OTHER PUBLICATIONS

Extended European Search Report dated Sep. 10, 2020 for EP Application No. 20161584.6, 10 pages.

*Primary Examiner* — Tho D Ta
(74) *Attorney, Agent, or Firm* — Schwabe, Williamson & Wyatt, P.C.

(57) ABSTRACT

Embodiments of the present disclosure relate to a connector to connect a printed circuit board (PCB) with a memory device, where the connector includes a housing couplable with the PCB; a first signal pin coupled with the housing, where the first signal pin includes a first portion that includes a first curve, and a second portion that extends from the first portion and includes a second curve; and a second signal pin coupled with the housing, where the second signal pin includes a third portion that includes a third curve, and a fourth portion that extends from the third portion and includes a fourth curve, where the first curve is curved in a first opposite direction relative to the third curve, and where the second curve is curved in a second opposite direction relative to the fourth curve.

7 Claims, 4 Drawing Sheets

(51) Int. Cl.
*H05K 5/02* (2006.01)
*H01R 12/73* (2011.01)
*H05K 1/18* (2006.01)
*H01R 12/70* (2011.01)
*H01R 12/72* (2011.01)
*H01R 13/6461* (2011.01)
*H01R 13/24* (2006.01)

(52) U.S. Cl.
CPC .................. *H01R 13/6461* (2013.01); *H05K 2201/10159* (2013.01); *H05K 2201/10189* (2013.01)

(56) References Cited

U.S. PATENT DOCUMENTS

| | | | |
|---|---|---|---|
| 6,196,880 B1 * | 3/2001 | Goodrich | H01R 13/6467 439/676 |
| 6,346,010 B1 * | 2/2002 | Emplit | H01R 13/6473 439/620.17 |
| 7,628,856 B2 * | 12/2009 | Sawabe | H01L 21/02658 117/91 |
| 8,944,863 B1 * | 2/2015 | Yang | H01R 13/6585 439/884 |
| 2004/0242072 A1 * | 12/2004 | Kumamoto | H01R 13/6585 439/607.05 |
| 2007/0155195 A1 | 7/2007 | He et al. | |
| 2012/0088410 A1 * | 4/2012 | Oniyama | H01R 13/6473 439/626 |
| 2014/0065881 A1 | 3/2014 | Vinay et al. | |
| 2015/0340817 A1 | 11/2015 | Li et al. | |
| 2016/0211629 A1 | 7/2016 | Phillips et al. | |
| 2019/0044289 A1 | 2/2019 | Li et al. | |
| 2019/0045622 A1 | 2/2019 | Liao et al. | |
| 2019/0102331 A1 | 4/2019 | Li et al. | |

\* cited by examiner

CROSSTALK REDUCING CONNECTOR PIN GEOMETRY

FIELD

Embodiments of the present disclosure relate to integrated circuits (IC), and in particular to crosstalk reducing connector pin geometry.

BACKGROUND

Computer systems, such as personal computers, laptops, etc., typically operate with persistent storage, e.g., hard drives and solid-state drives that do not lose data when power is removed, and non-persistent storage e.g., random-access memory (RAM) that loses data when power is removed. The non-persistent storage may be installed and updated by sliding memory modules into memory module connectors. Memory module connectors connect a memory module to a computer system's circuit board, e.g., a printed circuit board (PCB), such as a motherboard. In operation, a RAM module is typically inserted into a slot in the connector, which is mounted to the computer system's PCB. Along with providing a connection between the PCB and the RAM module, this also enables easy installation or convenient upgrading of the RAM.

BRIEF DESCRIPTION OF THE DRAWINGS

Embodiments will be readily understood by the following detailed description in conjunction with the accompanying drawings. To facilitate this description, like reference numerals designate like structural elements. Further, the same reference numerals may be used in different drawings to identify the same or similar elements. Embodiments are illustrated by way of example and not by way of limitation in the figures of the accompanying drawings.

DETAILED DESCRIPTION

Embodiments of the present disclosure relate to a connector to connect a PCB with a memory device, where the connector includes a housing couplable with the PCB; a first signal pin coupled with the housing, where the first signal pin includes a first portion that includes a first curve, and a second portion that extends from the first portion and includes a second curve; and a second signal pin coupled with the housing, where the second signal pin includes a third portion that includes a third curve, and a fourth portion that extends from the third portion and includes a fourth curve, where the first curve is curved in a first opposite direction relative to the third curve, and where the second curve is curved in a second opposite direction relative to the fourth curve.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A or B" or "A and/or B" means (A), (B), (A) or (B), or (A and B). For the purposes of the present disclosure, the phrase "A, B, or C" or "A, B, and/or C" means (A), (B), (C), (A and B), (A and C), (B and C), or (A, B and C).

Various operations may be described as multiple discrete operations, in turn, in a manner that is most helpful in understanding the illustrative embodiments; however, the order of description should not be construed as to imply that these operations are necessarily order dependent. In particular, these operations are not required to be performed in the order of presentation.

The description may use the phrases "in various embodiments," "in some embodiments," "in an embodiment," "in embodiments," and the like, which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

The following description may use certain terminology for the purpose of reference only, and thus are not intended to be limiting. For example, perspective-based descriptions such as "upper", "lower", "above", and "below", and "under" may refer to directions in the drawings to which reference is made. For another example, the foregoing terms, along with terms such as "front", "back", "top", "bottom", "rear", and "side" may describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import. Such descriptions are merely used to facilitate the discussion and are not intended to restrict the application of embodiments described herein to any particular orientation. Further, although such descriptions may be used based on one orientation, another description may be applicable if the orientation changes or if another orientation is applicable.

The term "based on," and the like, along with its derivatives, may be used herein. "Based on" may mean that one element is based entirely on another element, or "based on" may mean that one element is based at least in part on another element and thus may be based at least in part on other elements.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

As used herein, including in the claims, the term "chip" may refer to a physical IC on a computer. A chip in the context of this document may thus refer to an execution unit that can be single-core or multi-core technology.

As used herein, including in the claims, the term "processor" may refer to a logical execution unit on a physical chip. A multi-core chip may have several cores. As used herein the term "core" may refer to a logical execution unit containing an L1 (lowest level) cache and functional units. Cores are understood as being able to independently execute programs or threads.

A RAM module includes a series of RAM integrated circuits or die mounted on the module's PCB and may be referred to as dual in-line memory modules (DIMM). For compact computing systems, such as laptops, RAM modules are configured into small outline dual in-line memory modules (SODIMM). A SODIMM is inserted into a SODIMM connector that is mounted to the computer system's PCB, so that the SODIMM connector may provide a connection between the computing system's PCB and the SODIMM. As such, a SODIMM connector, or any type of connector, may have a module-facing or module-contacting end, and a PCB-facing or PCB-facing end. A connector typically has a plurality of pins to couple contacts on the memory module to contacts on the computer system's PCB. A pin is a type of contact to physically and electrically couple with another conductive contact, such as, for example, but not limited to, a pad.

In memory technology, such as, for example, but not limited to, double data rate (DDR) memory technology, including, but not limited to, DDR fifth generation RAM (DDR5) memory technology, that targets single-ended bus speeds up to, for example, but not limited to, 8 gigabits per second (Gbps), crosstalk may impact performance. Crosstalk may be, for example, interference or noise added to a signal on one connector pin from a signal on another connector pin. In general, proximately located pins may have inductive or capacitive coupling even if there is space between them, which results in crosstalk. Thus, connector pins, such as, for example, but not limited to, SODIMM connector pins, may cause crosstalk due to large inductive or capacitive coupling between signal pins and thus deteriorate signal integrity.

Crosstalk requirements for high speed memory technologies, such as, for example, but not limited to, DDR technologies, such as, for example, but not limited to, DDR5 technologies, may be stringent. This may impose challenges in, for example, but not limited to, SODIMM pin configuration and connector designs. Embodiments herein may enable connector pins, such as, for example, but not limited to, SODIMM connector pins, to have inherently, relatively low crosstalk, and thus increase signal quality. In addition, embodiments herein may simplify pin configuration without increasing the physical size of a connector. For example, crosstalk may be reduced by increasing the distance between pins without changing the shape of the pins. However, this may result in an increase in the number of pins and thus increase the physical size of a connector such as, for example, but not limited to, a SODIMM connector. Embodiments herein may reduce crosstalk without increasing the distance between pins or increasing the number of pins, though embodiments herein may be applicable along with increasing the distance between signal pins or increasing the number of pins.

FIGS. 1A, 1B, 1C, 1D, and 1E illustrate a connector for coupling a PCB with a memory device, in accordance with various embodiments. Connector 100 connects PCB 150 with a memory device 160. In an embodiment, the memory device 160 is a SODIMM module, and the connector 100 is a SODIMM connector. In an embodiment, connector 100 is a DDR5 connector, and memory device 160 is a DDR5 module. However, embodiments herein are not limited to SODIMM connectors or modules, DDR connectors or modules, or DDR5 connectors or modules. Connector 100 may be any type of connector, such as, for example, but not limited to, any type of Joint Electron Device Engineering Council (JEDEC)-standard based connector, a solid-state drive (SSD) connector, or a universal serial bus (USB) connector. Further, memory device 160 may be any type of memory device that may be connected to a PCB 150 with an applicable connector that is a connector 100 described in various embodiments herein.

Figure 1A:
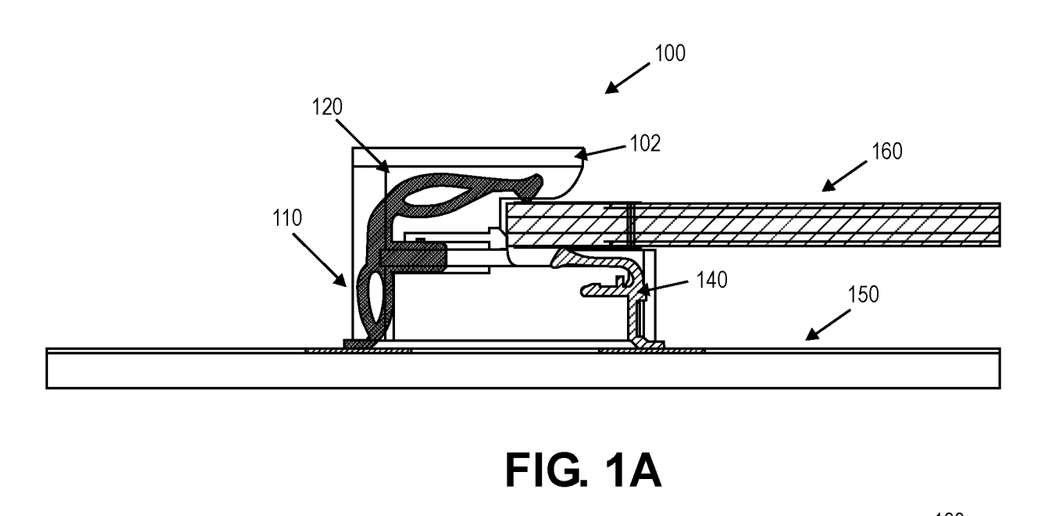
FIGS. 1A, 1B, 1C, 1D, and 1E illustrate a connector for coupling a PCB with a memory device, in accordance with various embodiments.
Figure 1B:
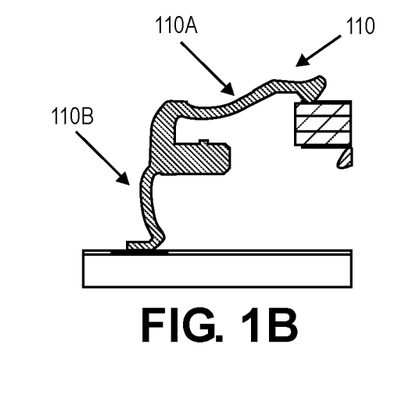
Figure 1C:
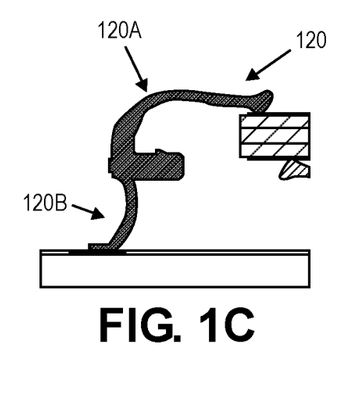
Figure 1D:
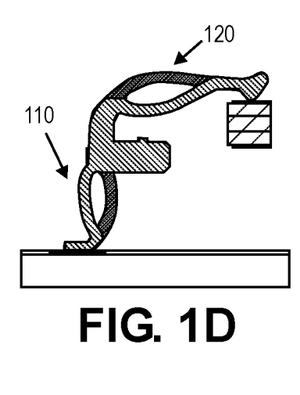

Connector 100 includes housing 102, couplable with PCB 150. Housing 102 may be, for example, a rigid nonconductive material such as a plastic or other nonconductive material. Housing 102 houses connector pins, such as, for example, signal pins 110 and 120, ground pins 130, and pin 140 described below (housing 102 is illustrated in a transparent manner or is not shown, in order not to obscure signal pin 110, signal pin 120, ground pin 130, or pin 140.) Pins may be housed by housing 102, if, for example, they are either located in housing 102 or physically supported or secured by housing 102, or both. Although FIG. 1A shows pins located inside housing 102, pins may be located outside of housing 102. PCB 150 typically includes a substrate upon which electronic components may be mounted and coupled with one another, and also typically includes conductive contacts to electrically couple components and provide power to components. Components may be attached (e.g., soldered) onto PCB 150 or embedded in PCB 150.

Connector 100 further includes a signal pin 110 coupled with housing 102, where the signal pin 110 includes a portion 110A that includes a first curve and a portion 110B that extends from the portion 110A and includes a second curve. A signal pin transmits data or control information. For example, signal pins may transmit signals such as data (DQ) signals or command/address (C/A) signals.

Connector 100 further includes a signal pin 120 coupled with the housing 102, where the signal pin 120 includes a portion 120A that includes a third curve and a portion 120B that extends from the portion 120A and includes a fourth curve. Further, the first curve is curved in a first opposite direction relative to the third curve, and the second curve is curved in a second opposite direction relative to the fourth curve.

In an embodiment, the first curve is curved downward away from portion 110A of signal pin 110, and the third curve is curved upward away from portion 120A of signal pin 120. In an embodiment, the second curve is curved outward away from portion 110B of signal pin 110, and the fourth curve is curved inward away from portion 120B of the signal pin 120. In another embodiment, the first curve may be curved upward away from portion 110A of signal pin 110, the third curve may be curved downward away from portion 120A of signal pin 120, the second curve may be curved inward away from portion 110B of signal pin 110, and the fourth curve may be curved outward away from portion 120B of signal pin 120. In an embodiment, signal pin 110 is adjacent to signal pin 120. A pin that is adjacent to another pin refers to the two pins being next to each other, beside each other, or neighboring.

Figure 1E:
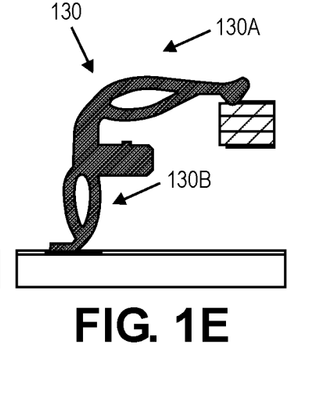

Connector 100 further includes a ground pin 130 coupled with the housing 102, as illustrated in FIG. 1E. In addition to providing a connection to ground, a ground pin may provide a shield against crosstalk between signal pins. In an embodiment, the ground pin 130 is adjacent to signal pin 110. In an embodiment, the ground pin 130 is between the signal pin 110 and the signal pin 120, where the ground pin 130 is adjacent to both signal pin 110 and signal pin 120.

In various embodiments, the connector 100 includes one ground pin 130 or more than one ground pin 130, where the one or more ground pins 130 include a portion 130A and a portion 130B that extends from the portion 130A. Accordingly, connector 100 includes one or more ground pins 130 coupled with the housing 102. In an embodiment, the signal pin 110 is adjacent to the signal pin 120, and the signal pin 110 and the signal pin 120 are between a first ground pin 130 and a second ground pin 130, where the signal pin 110 is adjacent a first ground pin 130 and the signal pin 120, and the signal pin 120 is adjacent to the signal pin 110 and a second ground pin 130.

In an embodiment, the portion 130A of ground pin 130 includes the first curve and second curve of signal pin 110, and portion 130B of ground pin 130 includes the third curve and fourth curve of signal pin 120. In another embodiment, portion 130A of ground pin 130 includes the first curve of signal pin 110 or the second curve of signal pin 110, and the portion 130B of ground pin 130 includes the third curve of signal pin 120 or the fourth curve of signal pin 120. In yet another embodiment, the portion 130A of ground pin 130 does not include a curve, and the portion 130B of ground pin 130 does not include a curve. Accordingly, ground pin 130 may include all of the curves of signal pins 110 and 120, fewer than all of the curves of signal pins 110 and 120, or none of the curves of signal pins 110 and 120. In various embodiments, connector 100 may include a first ground pin 130 that is the same as a second ground pin 130. In other embodiments, connector 100 may include a first ground pin 130 that is different that a second ground pin 130. Further, in various embodiments, pins include curves. However, embodiments herein are not limited to pins that include curves. For example, pins may include bends, such as, for example, but not limited to, triangular bends or rectangular bends, or may include, for example, notches.

SODIMM connector 100 may further include one or more pins 140, which may be signal pins or ground pins. As shown in FIG. 1A, the one or more pins 140 may be shorter in length than signal pins 110 and 120, and ground pin 130. Shorter pins may have less crosstalk due to lower inductive or capacitive coupling. Accordingly, various embodiments herein may have a greater impact on crosstalk for relatively taller or relatively longer pins, such as, for example, but not limited to, SODIMM connector pins, that include the geometries or shapes described in various embodiments. For example, embodiments herein may reduce crosstalk for connector pins, such as, for example, but not limited to, SODIMM connector pins, described in various embodiments, having a height of, for example, but not limited to, 5.2 millimeters (mm); crosstalk reduction may be even greater for taller or longer connector pins, such as, for example, but not limited to, SODIMM connector pins having a height of, for example, but not limited to, 8.0 mm, and may be even greater still for even taller or even longer connectors, such as, for example, but not limited to, SODIMM connector pins having a height of, for example, but not limited to, 9.2 mm.

In an embodiment, portion 110A is disposed at a substantially orthogonal angle relative to portion 110B; portion 120A is disposed at the substantially orthogonal angle relative to portion 120B; and/or portion 130A is disposed at the substantially orthogonal angle relative to the portion 130B. Further, a first portion of pin 140 may be disposed at a substantially orthogonal angle relative to a second portion of pin 140. In some embodiments, a substantially orthogonal angle is approximately 90 degrees. However, references to a substantially orthogonal angle may include any angle that is between and including 45 degrees and 90 degrees, including 90 degrees, such as, for example, but not limited to, approximately 60 degrees. Although various embodiments are described in terms of a portion of a connector pin being disposed at a substantially orthogonal angle relative to another portion of the connector pin, embodiments herein are not limited to substantially such orthogonal angles or to any particular angle. A portion of a connector pin may be disposed at any angle relative to another portion of the connector pin. Further, in various embodiments, portions of one pin in a connector are disposed at the same substantially orthogonal angle as the portions of another pin, or may be disposed at some other same angle as the portions of another pin. However, portions of one pin may be disposed at a different substantially orthogonal angle, or at a different other angle, than the portions of another pin. Further, although signal pins 110 and 120, ground pin 130, and pin 140 have the shapes shown in FIGS. 1A, 1B, 1C, 1D, and 1E, embodiments herein are not limited to the illustrated shapes. Embodiments herein may include any shape that separates corresponding portions (or even non-corresponding potions) of adjacent or non-adjacent signal pins to reduce or eliminate crosstalk, or any shape that enables portions of ground pins to provide a shield against crosstalk for corresponding portions (or even non-corresponding portions) of signal pins. Further, the pins may have any shape that results in corresponding portions (or even non-corresponding portions) of pins being separated as much as possible, to reduce or eliminate crosstalk or provide a shield against crosstalk.

In embodiments herein, signal pins, ground pins, and other pins may be any type of input/output pin in any type of connector. For example, the pins may be SSD connector pins, USB connector pins, or any types of JEDEC-standard based connector pins. Embodiments herein may include a connector pin, such as, for example, but not limited to, a SODIMM connector pin, having a shape to reduce crosstalk in, for example, but not limited to, high-speed DDR applications, single-ended applications, or differential applications. A single-ended application may include, for example, but is not limited to, measuring a voltage difference between a signal pin and a ground pin. A differential application may include, for example, but is not limited to, measuring a voltage difference between the signals on the signal pins, without reference to ground.

Signal characteristics of SODIMM connector pins in various embodiments may be evaluated with respect to near-end crosstalk (NEXT) and far-end crosstalk (FEXT) by 3-D finite element method (FEM) simulation comparison of simulation results for SODIMM connector pins described in various embodiments herein. For example, in a simulation, two signal-to-ground ratio configurations, 1:1 and 2:1, may be studied. One configuration may include a 1:1 ratio of signal pins to ground pins, while another configuration may include a 2:1 ratio of signal pins to ground pins. Both 1:1 (for example, DDR5 DQ) and 2:1 (for example, DDR5 C/A) configurations may experience reduced crosstalk through the use of connector pins, such as, for example, but not limited to, SODIMM connector pins, that include the geometries or shapes described in various embodiments.

Figure 2A:
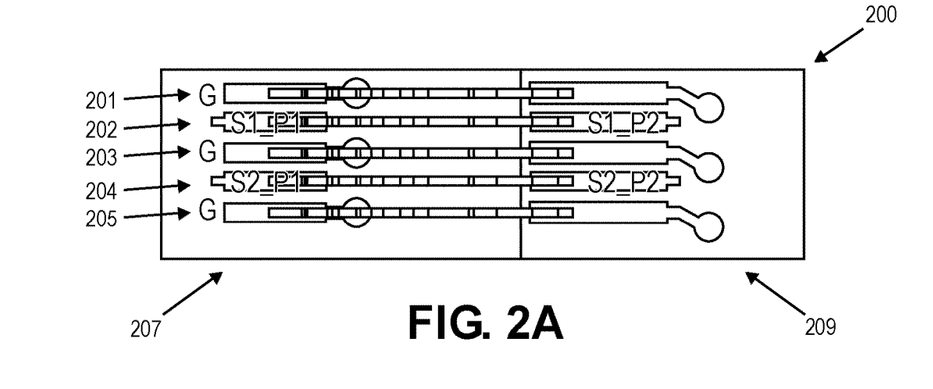
FIGS. 2A, 2B, and 2C illustrate a pin configuration and simulation results, in accordance with various embodiments.
Figure 2B:
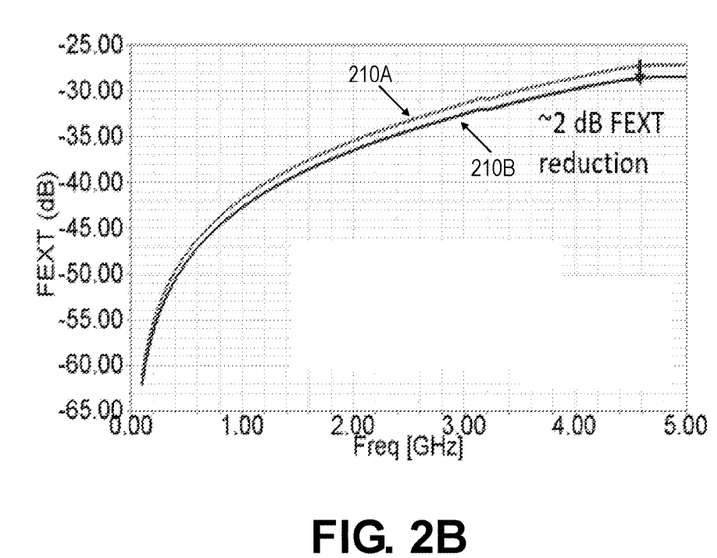
Figure 2C:
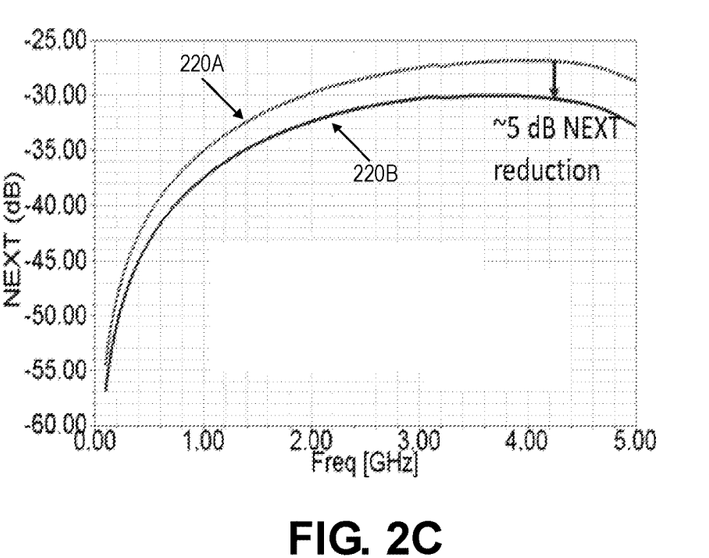

FIGS. 2A, 2B, and 2C illustrate a pin configuration and simulation results, in accordance with various embodiments. In particular, FIG. 2A illustrates a ground-signal-ground-signal-ground (GSGSG), 1:1 signal-to-ground ratio configuration 200, with ground pins 201, 203, and 205, a combination 202 of a signal pin 1 (P1) coupled with a SODIMM module 207 and a signal pin 2 (P2) coupled with a PCB 209, to carry a signal 1 (S1), and another P1-P2 combination 204 to carry a signal 2 (S2). FIG. 2B shows FEXT simulation results, while FIG. 2C shows NEXT simulation results, for a GSGSG, 1:1 signal-to-ground ratio pin configuration 200, where lines 210B and 220B show the results for SODIMM connector pins that include the geometries or shapes described in various embodiments, versus the results shown in lines 210A and 220A for SODIMM connector pins that do not include such geometries or shapes. For SODIMM connector pins described in various embodiments herein, the simulation results in FIG. 2B show that an approximately 2 dB FEXT reduction in crosstalk may be achieved, while the simulation results in FIG. 2C show that an approximately 5 dB NEXT reduction may be achieved, relative to SODIMM connector pins that do not include the geometries or shapes described in various embodiments herein.

Figure 3A:
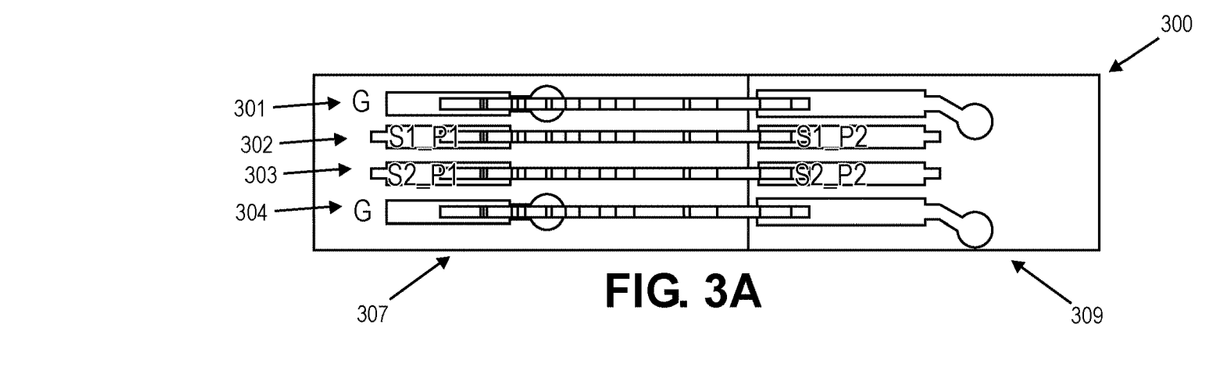
FIGS. 3A, 3B, and 3C illustrate another pin configuration and simulation results, in accordance with various embodiments.
Figure 3B:
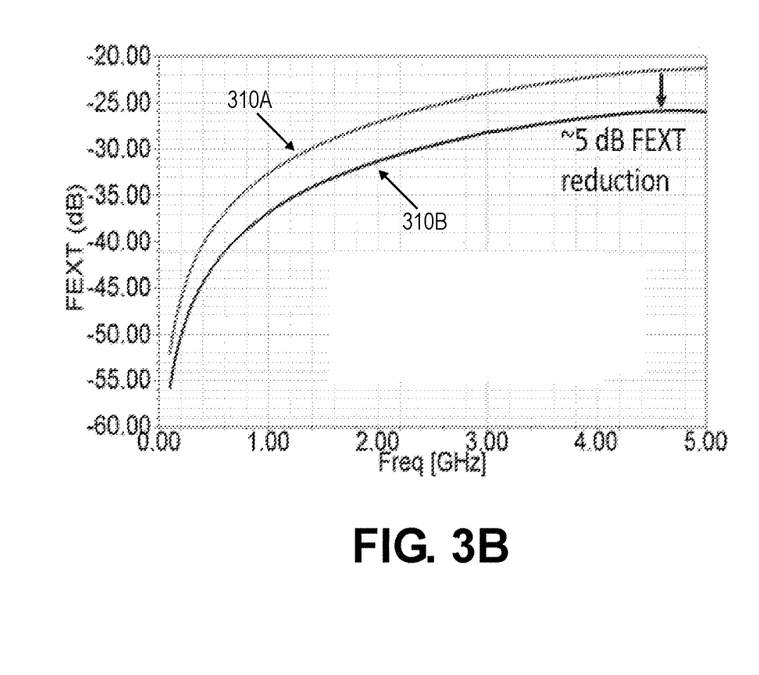
Figure 3C:
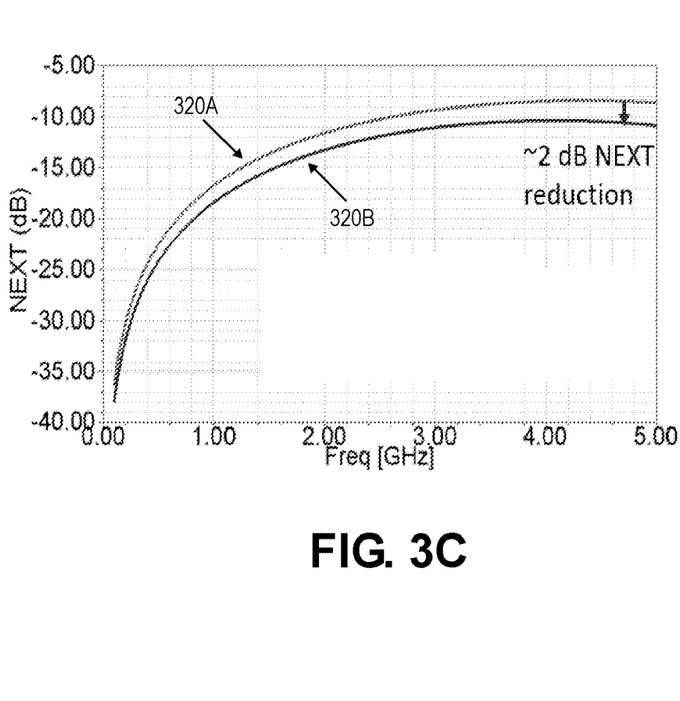

FIGS. 3A, 3B, and 3C illustrate another pin configuration and simulation results, in accordance with various embodiments. In particular, FIG. 3A illustrates a ground-signal-signal-ground (GSSG), 2:1 signal-to-ground ratio configuration 300, with ground pins 301 and 304, a combination 302 of a P1 coupled with a SODIMM module 307 and a P2 coupled with a PCB 309 to carry another S1, and another P1-P2 combination 303 to carry another S2. FIG. 3B shows FEXT simulation results, while FIG. 3C shows NEXT simulation results, for GSSG, 2:1 signal-to-ground ratio configuration 300, where lines 310B and 320B show the results for SODIMM connector pins that include the geometries or shapes described in various embodiments, versus the results shown in lines 310A and 320A for SODIMM connector pins that do not include such geometries or shapes. For SODIMM connector pins described in various embodiments herein, the simulation results in FIG. 3B show that an approximately 5 dB FEXT reduction in crosstalk may be achieved, while the simulation results in FIG. 3C show that an approximately 2 dB NEXT reduction may be achieved, relative to SODIMM connector pins that do not include the geometries or shapes described in various embodiments herein.

Embodiments herein may reduce crosstalk between signal pins, whether the pins are adjacent to each other or have a ground pin between them. In various embodiments, the top and bottom portions of one signal pin may be curved in opposite directions than the corresponding top and bottom portions of another signal pin, whether the signal pins are adjacent to each other or have a ground pin between them. For example, if the top portion of one signal pin is curved downward, and the bottom portion of that signal pin is curved outward, then the top portion of an adjacent signal pin is curved upward, and the bottom portion of that adjacent signal pin is curved inward. Similarly, for example, if the top portion of one signal pin is curved downward and the bottom portion of that signal pin is curved inward, then the top portion of an adjacent signal pin is curved upward, and the bottom portion of that adjacent signal pin is curved outward.

In various embodiments, a match in the lengths of signal pins, as well as the lengths of ground pins, where the pins have substantially equal length, is necessary. In other embodiments, a match in the lengths of signal pins, as well as the lengths of ground pins, may not be necessary. In various embodiments, where a match between the lengths of two signal pins, and/or the lengths of ground pins, is necessary, the total length of the signal pins and/or ground pins may be matched as a result of the opposite curves in the corresponding portions of the top and bottom portions of the two signal pins and/or the ground pins. This may provide, among other things, separation of signals while maintaining the continuity of the length of the pins.

In various embodiments, the curves in signal pins may be applied to neighboring single-ended signals, such as, for example, but not limited to, data signals, or command/control signals. In various embodiments, for differential signals, such as, for example, but not limited to, DQ strobe signals and clock signals, the shape of neighboring signals may be the same between an N and P pair, i.e., negative (N) and positive (P) signals, in order to, for example, provide tight intra-pair coupling.

In various embodiments, neighboring pins may curve in opposite directions, in order to provide crosstalk reduction or cancellation. The curves in the opposite directions help to reduce the extent to which adjacent or neighboring pins are parallel. As a result, part of a magnetic field between two signals may be perpendicular, which helps reduce or eliminate overall mutual inductance or capacitance or crosstalk. Further, the angle that results between two pins because of the curves helps to increase the distance between two neighboring signals, which further reduces or eliminates inductive or capacitive crosstalk coupling. While curves in the opposite directions help to reduce the extent to which adjacent or neighboring pins are parallel, the points at which pins contact a PCB or a memory device may be parallel, straight, or non-curved.

In addition, embodiments herein may increase the ability of ground pins to provide a shield against crosstalk between signal pins. If two signal pins are curved in opposite directions in their respective top and bottom portions, a ground pin may be shaped into the united bodies of the two signal pins, in order to provide solid ground referencing and crosstalk shielding for both signal pins. Connector pins, such as, for example, but not limited to, SODIMM connector pins, that do not have geometries or shapes described in embodiments herein have identical pin shapes, which causes large inductive or capacitive coupling, thus leading to greater crosstalk.

Figure 4:
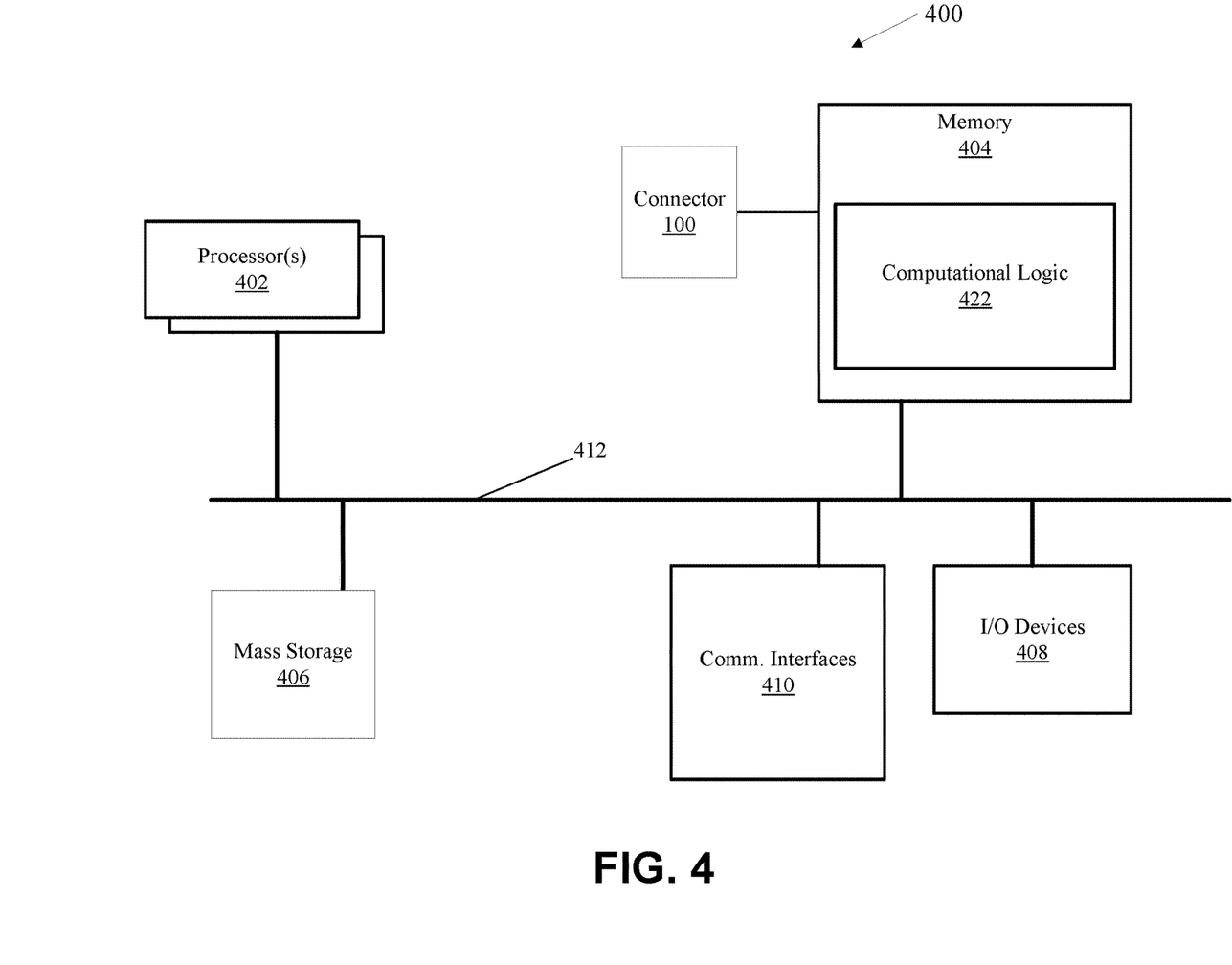
FIG. 4 illustrates an example computing device suitable to practice aspects of the present disclosure, in accordance with various embodiments.

FIG. 4 illustrates a block diagram of an example computing device 400 that may be suitable for use with or that may include a connector 100, in accordance with various embodiments. Computing device 400 may also be referred to as a computer system. Components of computing device 400 may be disposed on a same PCB, such as, for example, but not limited to, PCB 150, in some embodiments. As shown, computing device 400 may include one or more processors or processor cores 402 and system memory 404. For the purpose of this application, including the claims, the terms "processor" and "processor cores" may be considered synonymous, unless the context clearly requires otherwise. The processor 402 may include any type of processors, such as a central processing unit (CPU), a microprocessor, and the like. The processor 402 may be implemented as an integrated circuit having multi-cores, e.g., a multi-core microprocessor. In some embodiments, processors 402, in addition to cores, may further include hardware accelerators, e.g., hardware accelerators implemented with Field Programmable Gate Arrays (FPGA). The computing device 400 may include mass storage devices 406 (such as diskette, hard drive, non-volatile memory (NVM) (e.g., compact disc read-only memory (CD-ROM), digital versatile disk (DVD), any other type of suitable NVM, and so forth). In general, system memory 404 and/or mass storage devices 406 may be temporal and/or persistent storage of any type, including, but not limited to, volatile and non-volatile memory, optical, magnetic, and/or solid state mass storage, and so forth. Volatile memory may include, but is not limited to, static and/or dynamic random access memory (DRAM), and/or a memory device 160, which may be coupled with a connector 100, to couple the memory device 160 with a PCB of computing device 400. Non-volatile memory may include, but is not limited to, electrically erasable programmable read-only memory, phase change memory, resistive memory, and so forth.

The computing device 400 may further include I/O devices 408 (such as a display (e.g., a touchscreen display), keyboard, cursor control, remote control, gaming controller, image capture device, and so forth) and communication interfaces 410 (such as network interface cards, modems, infrared receivers, radio receivers (e.g., Bluetooth), and so forth), one or more antennas, and/or any other suitable component.

The communication interfaces 410 may include communication chips (not shown for clarity) that may be configured to operate the computing device 400 in accordance with a local area network (LAN) (e.g., Ethernet) and/or a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 410 may operate in accordance with other wireless protocols in other embodiments.

The above-described computing device 400 elements may be coupled to each other via system bus 412, which may represent one or more buses. In the case of multiple buses, they may be bridged by one or more bus bridges (not shown). Each of these elements may perform its conventional functions known in the art. In particular, system memory 404 and mass storage devices 406 may be employed to store a working copy and a permanent copy of the programming instructions for the operation of various components of computing device 400, including but not limited to an operating system of computing device 400, one or more applications, operations associated with computing device 400, operations associated with the processor 402, and/or operations associated with the mass storage device 406, collectively denoted as computational logic 422. The various elements may be implemented by assembler instructions supported by processor(s) 402 or high-level languages that may be compiled into such instructions. In some embodiments, processor 402 may be implemented as a fixed function ASIC, a FPGA, or any other suitable device with or without programmability or configuration options.

The permanent copy of the programming instructions may be placed into mass storage devices 406 in the factory, or in the field through, for example, a distribution medium (not shown), such as a compact disc (CD), or through communication interface 410 (from a distribution server (not shown)). That is, one or more distribution media having an implementation of the agent program may be employed to distribute the agent and to program various computing devices.

The number, capability, and/or capacity of the elements 408, 410, 412 may vary, depending on whether computing device 400 is used as a stationary computing device, such as a set-top box or desktop computer, or a mobile computing device, such as a tablet computing device, laptop computer, game console, or smartphone. Their constitutions are otherwise known, and accordingly will not be further described.

For some embodiments, at least one of processors 402 may be packaged together with computational logic 422 configured to practice aspects of embodiments described herein to form a System in Package (SiP) or a System on Chip (SoC).

In various implementations, the computing device 400 may comprise one or more components of a data center, a laptop, a netbook, a notebook, an ultrabook, a smartphone, a tablet, an ultra-mobile PC, or a mobile phone. In some embodiments, the computing device 400 may include one or more components of a server. In further implementations, the computing device 400 may be any other electronic device that processes data.

Machine-readable media (including non-transitory machine-readable media, such as machine-readable storage media), methods, systems and devices for performing the above-described techniques are illustrative examples of embodiments disclosed herein. Additionally, other devices in the above-described interactions may be configured to perform various disclosed techniques.

Various components described herein may be a means for performing the operations or functions described. Each component described herein may include software, hardware, or a combination of these. The components may be implemented as software modules, hardware modules, special-purpose hardware (e.g., application specific hardware, application specific integrated circuits (ASICs), digital signal processors (DSPs), etc.), embedded controllers, hardwired circuitry, and/or any other suitable hardware or software component. Besides what is described herein, various modifications may be made to the disclosed embodiments and implementations without departing from their scope.

Illustrative non-limiting examples of the technologies disclosed herein are provided below. An embodiment of the technologies may include any one or more, and any combination of, the examples described below.

EXAMPLES

According to various embodiments, the present disclosure describes a number of examples.

Example 1 is a connector to connect a printed circuit board (PCB) with a memory device, comprising: a housing couplable with the PCB; a first signal pin coupled with the housing, wherein the first signal pin includes a first portion that includes a first curve, and a second portion that extends from the first portion and includes a second curve; and a second signal pin coupled with the housing, wherein the second signal pin includes a third portion that includes a third curve, and a fourth portion that extends from the third portion and includes a fourth curve, wherein the first curve is curved in a first opposite direction relative to the third curve, and wherein the second curve is curved in a second opposite direction relative to the fourth curve.

Example 2 includes the connector of Example 1 or some other example herein, wherein the first curve is curved downward away from the first portion of the first pin, and wherein the third curve is curved upward away from the third portion of the second pin.

Example 3 includes the connector of Example 1, 2, or some other example herein, wherein the second curve is curved outward away from the second portion of the first pin, and wherein the fourth curve is curved inward away from the fourth portion of the second pin.

Example 4 includes the connector of Example 1, or some other example herein, wherein the first signal pin is adjacent to the second signal pin.

Example 5 includes the connector of Example 1, or some other example herein, wherein the connector further includes one or more ground pins coupled with the housing, and wherein the one or more ground pins include a fifth portion and a sixth portion that extends from the fifth portion.

Example 6 includes the connector of Example 5 or some other example herein, wherein a ground pin is between the first signal pin and the second signal pin.

Example 7 includes the connector of Example 5 or some other example herein, wherein the first signal pin is adjacent to the second signal pin, and wherein the first signal pin and the second signal pin are between a first ground pin and a second ground pin.

Example 8 includes the connector of Example 5, 6, 7, or some other example herein, wherein the ground pin includes a fifth portion that includes the first curve and the second curve, and wherein the ground pin includes a sixth portion that includes the third curve and the fourth curve.

Example 9 includes the connector of Example 5, 6, 7, or some other example herein, wherein the ground pin includes a fifth portion that includes the first curve or the second curve, and wherein the ground pin includes a sixth portion that includes the third curve or the fourth curve.

Example 10 includes the connector of Example 5, 6, 7, or some other example herein, wherein the first portion is disposed at a substantially orthogonal angle relative to the second portion, wherein the third portion is disposed at the substantially orthogonal angle relative to the fourth portion, and wherein the fifth portion is disposed at the substantially orthogonal angle relative to the sixth portion.

Example 11 includes the connector of Example 1, 4, 5, 6, 7, or some other example herein, wherein the memory device comprises a SODIMM, and wherein the connector comprises a SODIMM connector.

Example 12 is a connector that includes a ground pin, to connect a printed circuit board (PCB) with a memory device, the connector comprising: a housing couplable with the PCB; a first signal pin coupled with the housing, wherein the first signal pin includes a first portion that includes a first curve and a second portion that extends from the first portion and includes a second curve, and wherein the first portion is disposed at a substantially orthogonal angle relative to the second portion; and a second signal pin coupled with the housing, wherein the second signal pin includes a third portion that includes a third curve and a fourth portion that extends from the third portion and includes a fourth curve, wherein the third portion is disposed at the substantially orthogonal angle relative to the fourth portion, wherein the first curve is curved in a first opposite direction relative to the third curve, and wherein the second curve is curved in a second opposite direction relative to the fourth curve; and a ground pin, coupled with the housing, adjacent to the first signal pin.

Example 13 may include the connector of Example 12 or some other example herein, wherein the first curve is curved downward away from the first portion of the first pin, and wherein the third curve is curved upward away from the third portion of the second pin.

Example 14 may include the connector of Example 12, 13, or some other example herein, wherein the second curve is curved outward away from the second portion of the first pin, and wherein the fourth curve is curved inward away from the fourth portion of the second pin.

Example 15 may include the connector of Example 12 or some other example herein, wherein the ground pin includes a fifth portion and a sixth portion that extends from the fifth portion and is disposed at the substantially orthogonal angle relative to the fifth portion, and wherein the fifth portion includes the first curve and the second curve, and wherein the sixth portion includes the third curve and the fourth curve.

Example 16 may include the connector of Example 12, 15, or some other example herein, wherein the ground pin is adjacent to the second signal pin.

Example 17 may include the connector of Example 12, 15, or some other example herein, wherein the first signal pin is adjacent to the second signal pin.

Example 18 is a computer system, comprising: a circuit board; and a connector coupled with the circuit board, wherein the connector comprises: a housing couplable with the PCB; a first signal pin coupled with the housing, wherein the first signal pin includes a first portion that includes a first curve, and a second portion that extends from the first portion and includes a second curve; and a second signal pin coupled with the housing, wherein the second signal pin includes a third portion that includes a third curve, and a fourth portion that extends from the third portion and includes a fourth curve, wherein the first curve is curved in a first opposite direction relative to the third curve, and wherein the second curve is curved in a second opposite direction relative to the fourth curve.

Example 19 may include the computer system of Example 18 or some other example herein, wherein the first curve is curved downward away from the first portion of the first pin, wherein the third curve is curved upward away from the third portion of the second pin, wherein the second curve is curved outward away from the second portion of the first pin, and wherein the fourth curve is curved inward away from the fourth portion of the second pin.

Example 20 may include the computer system of Example 18, 19, or some other example herein, further comprising a ground pin, coupled with the housing, wherein the ground pin includes a fifth portion and a sixth portion that extends from the fifth portion, and wherein the fifth portion includes the first curve and the second curve, and wherein the sixth portion includes the third curve and the fourth curve.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions stored thereon that, when executed, result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A connector to connect a printed circuit board (PCB) with a memory device, comprising:
    a housing couplable with the PCB;
    a first signal pin coupled with the housing, wherein the first signal pin includes a first portion that includes a first curve, and a second portion that extends from the first portion and includes a second curve; and
    a second signal pin coupled with the housing and disposed adjacent to the first signal pin, wherein the second signal pin includes a third portion that includes a third curve, and a fourth portion that extends from the third portion and includes a fourth curve, wherein the first curve is curved in a first opposite direction relative to the third curve, and wherein the second curve is curved in a second opposite direction relative to the fourth curve,
    wherein the first curve is curved downward away from the first portion of the first signal pin, and wherein the third curve is curved upward away from the third portion of the second signal pin, wherein the second curve is curved outward away from the second portion of the first signal pin, and wherein the fourth curve is curved inward away from the fourth portion of the second signal pin, wherein the first signal pin is to couple with the PCB at an end of the second curve, wherein the second signal pin is to couple with the PCB by an end of the third curve; and
    a ground pin, coupled with the housing, adjacent to the first signal pin and the second signal pin, wherein the ground pin includes a fifth portion and a sixth portion that extends from the fifth portion and is disposed at a substantially orthogonal angle relative to the fifth portion, wherein the fifth portion includes the first curve and the second curve, and wherein the sixth portion includes the third curve and the fourth curve,
    wherein the first curve of the ground pin is curved outward from the fifth portion, and wherein the second curve of the ground pin is curved inward away from the fifth portion, forming a void between the first and second curves of the ground pin,
    wherein the third curve of the ground pin is curved upward away from the second portion, and wherein the fourth curve of the ground pin is curved inward away from the second portion, forming a void between the third and fourth curves of the ground pin, and
    wherein the ground pin is to couple with the PCB by the end of the sixth portion that comprises an end of the third curve and an end of the fourth curve of the ground pin.

2. The connector of claim 1, wherein a ground pin is between the first signal pin and the second signal pin.

3. The connector of claim 1, wherein the first portion is disposed at a substantially orthogonal angle relative to the second portion, wherein the third portion is disposed at the substantially orthogonal angle relative to the fourth portion, and wherein the fifth portion is disposed at the substantially orthogonal angle relative to the sixth portion.

4. The connector of claim 1, wherein the memory device comprises a SODIMM, and wherein the connector comprises a SODIMM connector.

5. A connector, to connect a printed circuit board (PCB) with a memory device, the connector comprising:
    a housing couplable with the PCB;
    a first signal pin coupled with the housing, wherein the first signal pin includes a first portion that includes a first curve and a second portion that extends from the first portion and includes a second curve, and wherein the first portion is disposed at a substantially orthogonal angle relative to the second portion; and
    a second signal pin coupled with the housing and disposed adjacent to the first signal pin, wherein the second signal pin includes a third portion that includes a third curve and a fourth portion that extends from the third portion and includes a fourth curve, wherein the third portion is disposed at the substantially orthogonal angle relative to the fourth portion, wherein the first curve is curved in a first opposite direction relative to the third curve, and wherein the second curve is curved in a second opposite direction relative to the fourth curve,
    wherein the first curve is curved downward away from the first portion of the first signal pin, and wherein the third curve is curved upward away from the third portion of the second signal pin, wherein the second curve is curved outward away from the second portion of the first signal pin, and wherein the fourth curve is curved inward away from the fourth portion of the second signal pin, wherein the first signal pin is to couple with the PCB at an end of the second curve, wherein the second signal pin is to couple with the PCB by an end of the third curve; and
    a ground pin, coupled with the housing, adjacent to the first signal pin and the second signal pin, wherein the ground pin includes a fifth portion and a sixth portion that extends from the fifth portion and is disposed at the substantially orthogonal angle relative to the fifth portion, wherein the fifth portion includes the first curve and the second curve, and wherein the sixth portion includes the third curve and the fourth curve, wherein the first curve of the ground pin is curved outward from the fifth portion, and wherein the second curve of the ground pin is curved inward away from the fifth portion, forming a void between the first and second curves of the ground pin, wherein the third curve of the ground pin is curved upward away from the second portion, and wherein the fourth curve of the ground pin is curved inward away from the second portion, forming a void between the third and fourth curves of the ground pin, and wherein the ground pin is to couple with the PCB by the end of the sixth portion that comprises an end of the third curve and an end of the fourth curve of the ground pin.

6. The connector of claim 5, wherein the ground pin is adjacent to the second signal pin.

7. A computer system, comprising:
   a circuit board; and
   a connector coupled with the circuit board, wherein the connector comprises:
      a housing couplable with the circuit board;
      a first signal pin coupled with the housing, wherein the first signal pin includes a first portion that includes a first curve, and a second portion that extends from the first portion and includes a second curve; and
      a second signal pin coupled with the housing and disposed adjacent to the first signal pin, wherein the second signal pin includes a third portion that includes a third curve, and a fourth portion that extends from the third portion and includes a fourth curve, wherein the first curve is curved in a first opposite direction relative to the third curve, and wherein the second curve is curved in a second opposite direction relative to the fourth curve, wherein the first curve is curved downward away from the first portion of the first signal pin, and wherein the third curve is curved upward away from the third portion of the second signal pin, wherein the second curve is curved outward away from the second portion of the first signal pin, and wherein the fourth curve is curved inward away from the fourth portion of the second signal pin, wherein the first signal pin is to couple with the circuit board at an end of the second curve, wherein the second signal pin is to couple with the circuit board by an end of the third curve; and a ground pin, coupled with the housing, adjacent to the first signal pin and the second signal pin, wherein the ground pin includes a fifth portion and a sixth portion that extends from the fifth portion and is disposed at a substantially orthogonal angle relative to the fifth portion, wherein the fifth portion includes the first curve and the second curve, and wherein the sixth portion includes the third curve and the fourth curve, wherein the first curve of the ground pin is curved outward from the fifth portion, and wherein the second curve of the ground pin is curved inward away from the fifth portion, forming a void between the first and second curves of the ground pin, wherein the third curve of the ground pin is curved upward away from the second portion, and wherein the fourth curve of the ground pin is curved inward away from the second portion, forming a void between the third and fourth curves of the ground pin, and wherein the ground pin is to couple with the circuit board by the end of the sixth portion that comprises an end of the third curve and an end of the fourth curve of the ground pin.

* * * * *